US007298027B2

(12) United States Patent
Yea et al.

(10) Patent No.: US 7,298,027 B2

(45) Date of Patent: Nov. 20, 2007

(54) SMT THREE PHASE INVERTER PACKAGE AND LEAD FRAME

(75) Inventors: Sung H. Yea, La Canada, CA (US); Sam Sundaram, Torrance, CA (US); Vijay Bolloju, Cerritos, CA (US)

(73) Assignee: International Rectifier Corporation, El Seguno, CA (US)

( * ) Notice: Subject to any disclaimer, the term of this patent is extended or adjusted under 35 U.S.C. 154(b) by 66 days.

(21) Appl. No.: 11/218,019

(22) Filed: Sep. 1, 2005

(65) Prior Publication Data

US 2006/0043545 A1 Mar. 2, 2006

Related U.S. Application Data

(60) Provisional application No. 60/606,859, filed on Sep. 2, 2004.

(51) Int. Cl.
*H01L 23/495* (2006.01)

(52) U.S. Cl. ...................... 257/666; 257/668; 257/724; 257/678; 438/55; 438/124; 438/106

(58) Field of Classification Search ................ 257/666, 257/668, 724

See application file for complete search history.

(56) References Cited

U.S. PATENT DOCUMENTS

| | | | | |
|---|---|---|---|---|
| 5,977,630 | A * | 11/1999 | Woodworth et al. | 257/712 |
| 2001/0048154 | A1 * | 12/2001 | Cheah et al. | 257/723 |
| 2002/0149094 | A1 * | 10/2002 | Sakabe | 257/676 |
| 2003/0146498 | A1 * | 8/2003 | Kondo et al. | 257/666 |
| 2004/0095729 | A1 * | 5/2004 | Vaysse et al. | 361/710 |

* cited by examiner

*Primary Examiner*—Theo X Le
*Assistant Examiner*—Marc-Anthony Armand
(74) *Attorney, Agent, or Firm*—Ostrolenk, Faber, Gerb & Soffen, LLP

(57) ABSTRACT

A surface mounted package for semiconductor die has a lead frame with a first and elongated die pad which receives three MOSgated die spaced along its length; second, third and fourth die pads laterally spaced from the first die pad and in a row parallel to the first die pad and receiving respective MOSgated die. A central wire bond receiving pad is disposed between the first pad and the spaced second, third and fourth pads. Wire bonds then connect the die into a three phase inverter circuit. Pin connectors extend through a plastic housing covering the top of the lead frame and are connectable, with the die pads, to the surface of a PCB.

13 Claims, 4 Drawing Sheets

SMT THREE PHASE INVERTER PACKAGE AND LEAD FRAME

RELATED APPLICATIONS

This application claims the benefit and priority of U.S. Provisional Application No. 60/606,859, filed Sep. 2, 2004, the entire disclosure of which is incorporated by reference herein.

FIELD OF THE INVENTION

This invention relates to a surface mount package semiconductor die and more specifically relates to a novel lead frame for such packages.

BACKGROUND OF THE INVENTION

Semiconductor device packages for plural semiconductor die are well known. Such packages have thin conductive lead frames which are stamped or otherwise shaped to provide pads to which die can be mounted and then interconnected by wire bonds. The device is then overmolded, leaving external pins and exposed bottom surfaces for electrical and thermal connection to traces on printed circuit boards (PCBs).

BRIEF DESCRIPTION OF THE INVENTION

The present invention is for a novel lead frame for surface mount package which provides die pads which are so arranged as to receive multiple die which preferably form a high voltage (above about 500 volts) three phase inverter with low cost, high die area to package area ratio (a high packaging and power density) and a reduced $R_{THJC}$. The package of the invention has application, for example, to motor drives up to about 100 watts for pumps, fans, and the like and does not need a heat sink.

The lead frame has a first elongated pad for receiving the same power electrode of a plurality of spaced die and three separated pads extending coplanarly parallel to and laterally spaced from the first pad for receiving the other power electrodes of respective ones of other die. A central coplanar spaced wire bond area or strip is insulated from and is placed between the first pad and the plurality of spaced pads, for receiving wire bonds from die of the plurality of spaced pads.

Straight and generally parallel wire bonds then connect die on the first pad to respective ones of the plurality of pads and the die on the plurality of pads are wire bonded to the central wire bond area or strip. This arrangement permits a very simple wire bond operation for low resistance, low inductance connection between the die.

The novel lead frame of the invention has the following benefits:

- Low Package cost
- The SMT package, simplifies the assembly and reduces the assembly cost
- Standard SMT mounting techniques can be applied
- A high die size to foot-print ratio allows better utilization of a PCB support area
- No heat sink is required up to 100 W
- Low $R_{THJC}$, allows better utilization of the silicon die and hence reduces the cost of the circuit formed, such as an inverter
- Low package inductance reduces loses and EMI noise

- The power range can be extended as by using three half bridges in a package
- Easily expandable package concept: flexible lead frame and pin-out
- Flexible package can accommodate multiple die sizes
- MOSFETs or IGBT co-packs can be integrated

DETAILED DESCRIPTION OF THE PREFERRED EMBODIMENTS

Figure 1:
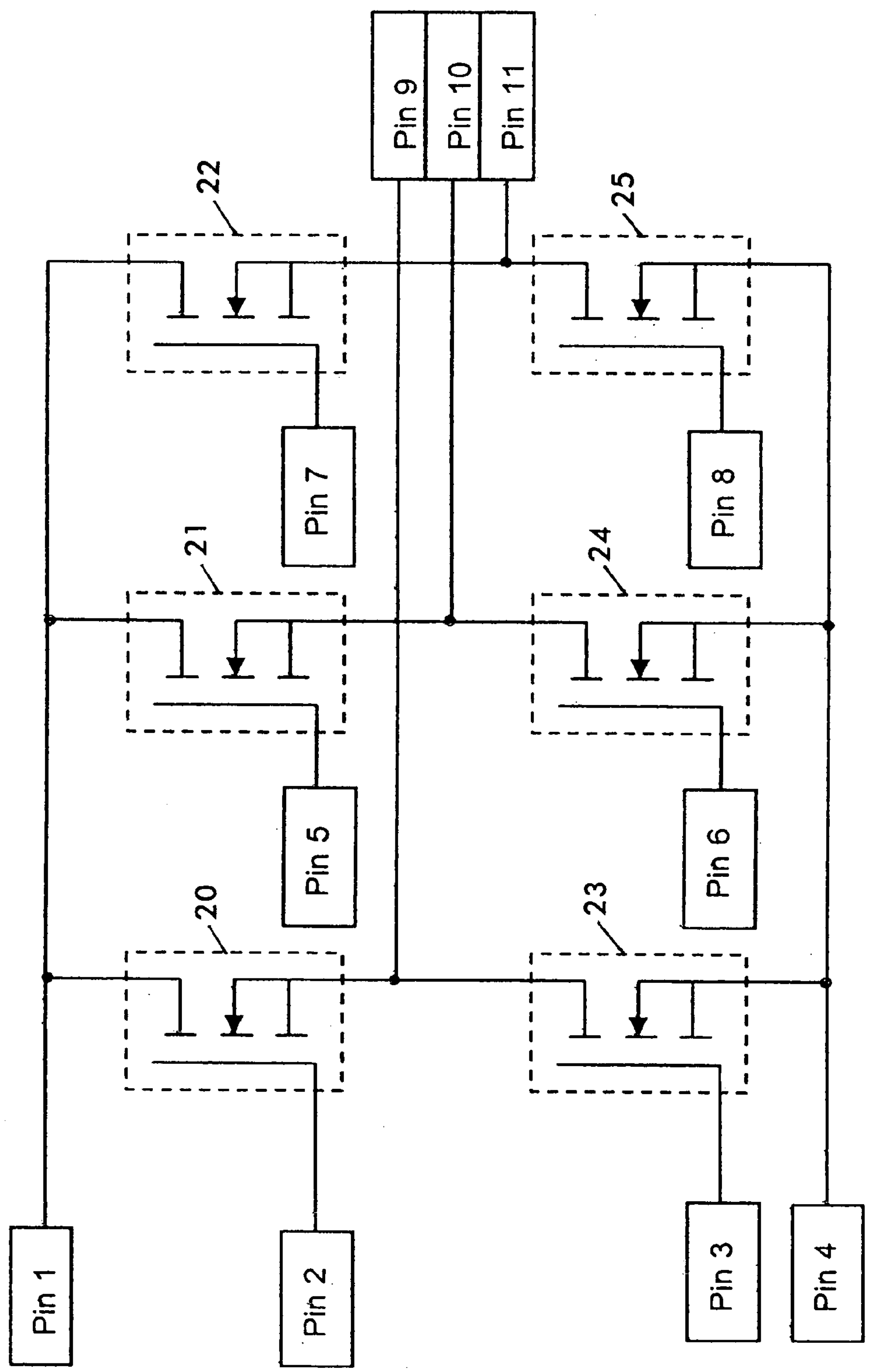
FIG. 1 is a circuit diagram of a known three phase inverter, which is one circuit which can beneficially employ the lead frame and package of the invention.

Referring first to FIG. 1, there is shown a three phase inverter circuit which is a typical circuit which can employ the lead frame of the invention.

Such circuits will contain 6 die, 3 of which share a first power electrode, and the other 3 sharing a second power electrode. Thus, die 20, 21 and 22 are MOSFET die sharing a common drain electrode connection while die 23, 24 and 25 share a common source electrode connection. While die 20 to 25 are shown as MOSFETs, they could be IGBT and diode copacks (or more generally, MOSgated devices) and can be silicon and or III nitride type devices or mixes thereof. The die are sized as desired and could be used for circuits up to about 100 watts.

The drain electrodes of MOSFETs 20, 21 and 22 are connected to a common terminal Pin 1 and the source electrodes of MOSFETs 23, 24 and 25 are connected to a common terminal Pin 4. The gate electrodes of MOSFETs 20, 21 and 22 are connected to Pin 2, Pin 5 and Pin 7, respectively; and the gate electrodes of MOSFETs 23, 24 and 25 are connected to terminal Pin 3, Pin 6 and Pin 8, respectively. The nodes of MOSFETs 20, 23; 21, 24 and 22, 25 are connected to terminal Pins 9, 10 and 11, respectively.

When the circuit is operated as a 3 phase inverter, Pins 1 and 4 are connected to an input DC source and Pins 9, 10 and 11 define a 3 phase AC output. The locations of Pins 1 to 11 are identified in FIG. 3, to be later described.

A conventional driver circuit is connected to central pins 2, 3, 5, 6, 7, 8 to drive the inverter operation as desired.

Figure 2:
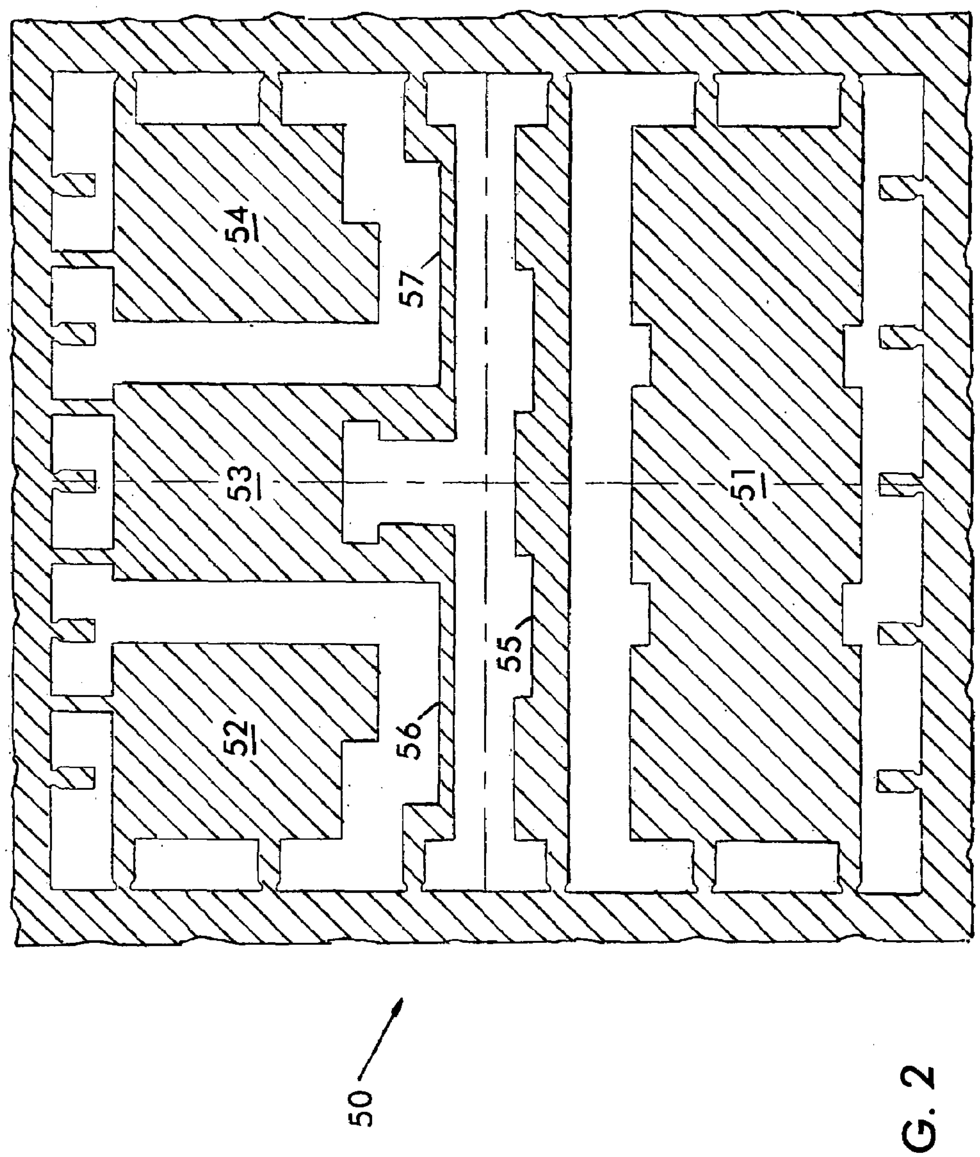
FIG. 2 is a top view of the lead frame of the invention before reception of die and trimming of the frame.

The novel lead frame 50 of the invention for the circuit of FIG. 1, is shown in FIG. 2 before die are mounted on the lead frame. Lead frame 50 may be about 11 mm by 12 mm, as shown (non-critical), and dependent upon die size and power rating, and may be a conventional thin plated copper frame, stamped to the shape shown. The metal remaining after stamping is cross-hatched for clarity in FIG. 2.

The lead frame 50 has a lower elongated pad 51 and upper spaced pads 52, 53 and 54 all of which are spaced and electrically insulated from one another after die mounting and trimming. A central common source connection pad 55, which will receive the sources of die mounted on pad 51 is provided. The central pad 53 has lateral extensions 56 and 57 as shown.

Figure 3:
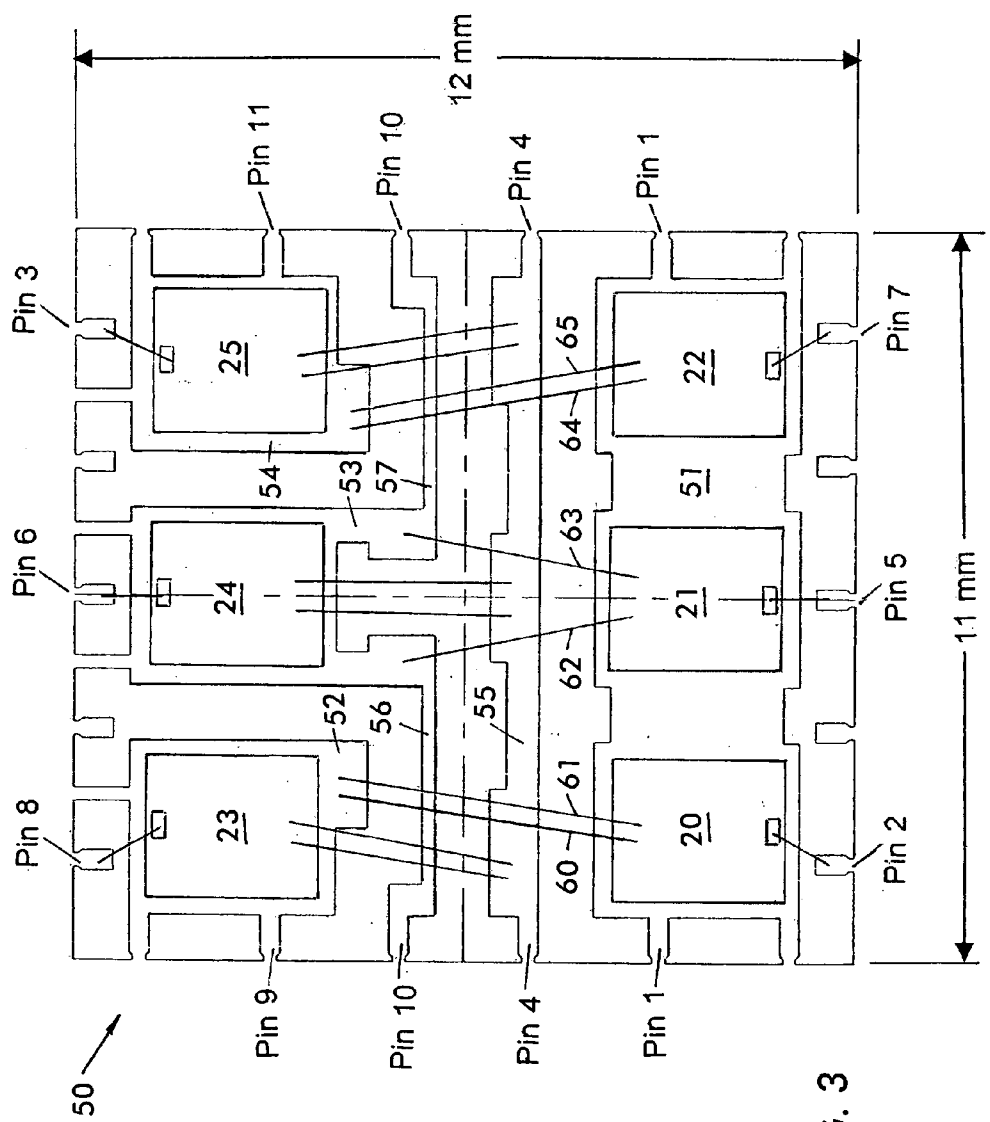
FIG. 3 shows the lead frame of FIG. 2 after the mounting of six die and the wire bonding of the die electrodes to selected frame locations.

FIG. 3 shows the lead frame of FIG. 2 after die mounting, wire bonding and trimming. Thus, MOSFET die 20, 21 and 22, which are vertical conduction MOSFETs with a drain electrode on their bottom surface and source and gate electrodes on their top surface, have their drain electrodes soldered or otherwise conductively adhered to the common elongated pad 51, and are spaced as shown. Die 23, 24 and 25 are centrally mounted on pads 52, 53 and 54 as shown.

The top source electrodes of die 20, 21 and 22 are then wire bonded to pads 52, 53 and 54 respectively by wire bonds 60, 61; 62, 63 and 64, 65 respectively. Note that wire bonds 62 and 63 are connected to pad 53 vie extensions 56 and 57 respectively.

The sources of die 20 to 25 are wire bonded to pins 9, 10, 11, 4, 4 and 4 respectively.

Figure 5:
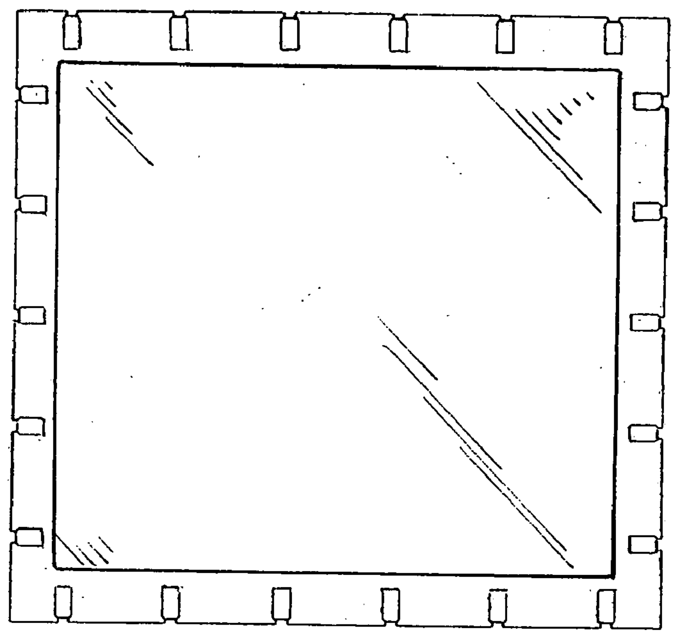
FIG. 5 is a bottom view of FIG. 4, showing the bottom lead frame surfaces and connection pins which can be soldered to a PCB or other package support.
Figure 4:
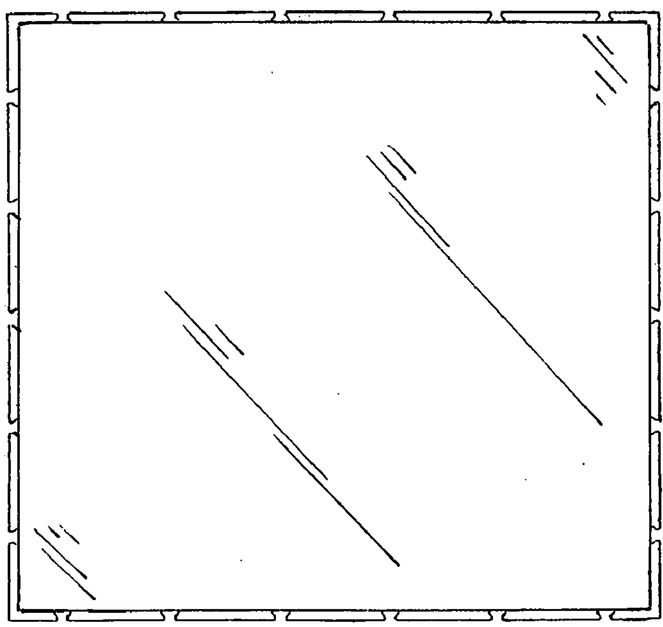
FIG. 4 is a top view of a package in which the lead frame and die of FIG. 3 have been overmolded by a suitable insulation mold compound.

The assembled lead frame and die of FIG. 3 is then conventionally overmolded, as shown in FIGS. 4 and 5, with the pins 1 to 11 of FIGS. 1 and 3 exposed around the bottom of the package (FIG. 5), to make surface mount connection to patterns on a printed circuit board. Note that the bottom of the lead frame 50 can make good thermal connection to the PCB or other support. Further, the bottom of the separated and insulated pads 51 and 52, 53 and 54 can be soldered to the PCB board or other support receiving the package for electrical and thermal purposes.

It will be seen that the novel lead frame of the invention provides a flexible pin-out configuration.

The package of the invention employs well known manufacturing techniques and is a low cost package. Standard surface mounting techniques can be used with the package. Further, the package provides a high die size to foot-print ratio, allowing better use of the available PCB area. No heat sink is needed for mounting the device for power ratings less than about 100 watts.

The package has a low $R_{THJC}$, allowing a better use of silicon (reduced die size for a given rating) and thus reduces the cost of the inverter. Further, the package has a low inductance due to the routing of the wire bonds and die placement thereby reducing losses and EMI noise.

It will be apparent that other circuits can be laid out on the lead frame, for example, three half bridges in one package. Multiple die and mixed die sizes can also be used.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A surface mount semiconductor die assembly comprising a lead frame and a first and second plurality of die to be interconnected to form a circuit;

said lead frame comprising a thin, flat elongated pad for reception of a first plurality of die spaced along its length; second, third, and fourth pads laterally spaced from said first pad and coplanar therewith and in line with one another for receiving respective ones of a second plurality of die; and a thin elongated wire bond receiving pad disposed spaced from one edge of said first elongated pad and one edge of said second, third and fourth pads and coplanar therewith;

said first and second plurality of die each having first and second power electrodes on their respective opposite surfaces, and including a gate electrode; said first power electrodes of said first plurality of die conductively mounted on said first pad with said first plurality of die in a generally straight row along the length of said first pad;

said second power electrode of said die generally centrally conductively mounted on said second, third, and fourth pads respectively;

said second power electrodes of said first plurality of die being wire bonded to said second, third and fourth pads respectively;

said first power electrode of said second plurality of die being wire bonded to said thin wire bond receiving pad; and a first plurality of gate pins disposed spaced opposite from another edge of said first elongated pad opposite said one edge thereof, and a second plurality of gate pins each disposed spaced opposite another edge of a respective one of said second, third, and fourth pads opposite said one edge thereof;

wherein each of said gate pins is disposed near a respective one of said die, said gate electrodes being electrically connected to said respective ones of said gate pins.

2. The assembly of claim 1, wherein said wire bonds are generally parallel to one another and are of the same approximate length.

3. The assembly of claim 1, wherein said die are MOS-gated devices.

4. The assembly of claim 1, which further includes input and output pins on the periphery of said lead frame and connected to said first pad, said thin wire bond pad, and to said second, third and fourth pad respectively.

5. The assembly of claim 1, wherein said first and second pluralities of die are connected to define a three phase inverter circuit.

6. The assembly of claim 1, which further includes a plastic housing over the upper surface of said lead frame, die and wire bonds.

7. The assembly of claim 2, which further includes a plastic housing over the upper surface of said lead frame, die and wire bonds.

8. The assembly of claim 3, which further includes a plastic housing over the upper surface of said lead frame, die and wire bonds.

9. The assembly of claim 4, which further includes a plastic housing over the upper surface of said lead frame, die and wire bonds.

10. The assembly of claim 5, which further includes a plastic housing over the upper surface of said lead frame, die and wire bonds.

11. The assembly of claim 9, wherein said pins are exposed through said housing for external connection.

12. The assembly of claim 4, wherein said first second, third and fourth pads and bond wire receiving pad are spaced from and are electrically insulated from one another.

13. The assembly of claim 12, wherein said third pad is disposed between said second and third pads; and thin first and second wire bond extension pads extending from said third wire pad and disposed between said wire bond receiving pads.

* * * * *